United States Patent
Harivel et al.

(10) Patent No.: US 10,539,039 B2
(45) Date of Patent: Jan. 21, 2020

(54) METHOD OF MEASURING THE TEMPERATURE REACHED BY A PART, IN PARTICULAR A TURBINE ENGINE PART

(71) Applicant: SAFRAN AIRCRAFT ENGINES, Paris (FR)

(72) Inventors: Nadine Alice Helene Harivel, Vauz le Penil (FR); Sarah Hamadi, Paris (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 499 days.

(21) Appl. No.: 14/420,481

(22) PCT Filed: Aug. 12, 2013

(86) PCT No.: PCT/FR2013/051931
§ 371 (c)(1),
(2) Date: Feb. 9, 2015

(87) PCT Pub. No.: WO2014/027162
PCT Pub. Date: Feb. 20, 2014

(65) Prior Publication Data
US 2015/0204198 A1   Jul. 23, 2015

(30) Foreign Application Priority Data

Aug. 14, 2012 (FR) .................................. 12 57815
Aug. 17, 2012 (FR) .................................. 12 57855

(51) Int. Cl.
*F01D 21/00* (2006.01)
*G01K 11/00* (2006.01)
(Continued)

(52) U.S. Cl.
CPC ............ *F01D 21/003* (2013.01); *C23C 14/08* (2013.01); *C23C 14/22* (2013.01); *C23C 14/52* (2013.01);
(Continued)

(58) Field of Classification Search
None
See application file for complete search history.

(56) References Cited

U.S. PATENT DOCUMENTS 3,257,230 A * 6/1966 Wachtell ................. C23C 10/34
427/250
4,005,989 A * 2/1977 Preston ..................... B32B 15/01
428/651
(Continued)

FOREIGN PATENT DOCUMENTS

EP    2 412 846          2/2012
FR    2957358 A1 *   9/2011    ......... C23C 18/1216
(Continued)

OTHER PUBLICATIONS

Gentleman, M.M., and D.R. Clarke. "Concepts for luminescence sensing of thermal barrier coatings." Surface and Coatings Technology, vol. 188-189, 2004, pp. 93-100. (Year: 2004).*
(Continued)

*Primary Examiner* — Mary E McManmon
*Assistant Examiner* — Richard K. Durden
(74) *Attorney, Agent, or Firm* — Oblon, McClelland, Maier & Neustadt, L.L.P.

(57) ABSTRACT

A method of measuring temperature reached by a part, for example a turbine engine part, in operation, the method including: mechanically treating the part; oxidizing the part; and depositing a layer including a temperature indicator for indicating the temperature reached by the part in operation.

12 Claims, 2 Drawing Sheets

(51) Int. Cl.
- *C23C 14/22* (2006.01)
- *F01D 5/28* (2006.01)
- *F01D 25/00* (2006.01)
- *G01K 11/20* (2006.01)
- *C23C 14/08* (2006.01)
- *C23C 14/52* (2006.01)

(52) U.S. Cl.
CPC ............. *F01D 5/28* (2013.01); *F01D 25/005* (2013.01); *G01K 11/20* (2013.01)

(56) References Cited

U.S. PATENT DOCUMENTS

| | | | | |
|---|---|---|---|---|
| 4,371,312 | A * | 2/1983 | Tank | C22C 32/0026 156/325 |
| 4,460,274 | A * | 7/1984 | Schumann | G01N 21/8422 250/459.1 |
| 4,774,150 | A * | 9/1988 | Amano | C23C 4/02 116/200 |
| 5,262,245 | A * | 11/1993 | Ulion | C23C 14/024 427/532 |
| 5,538,796 | A * | 7/1996 | Schaffer | C23C 14/02 148/675 |
| 5,562,998 | A * | 10/1996 | Strangman | C23C 4/18 428/612 |
| 5,975,852 | A * | 11/1999 | Nagaraj | C23C 14/028 415/200 |
| 5,985,467 | A * | 11/1999 | Beele | C23C 14/024 416/241 B |
| 6,103,386 | A * | 8/2000 | Raybould | C23C 28/00 428/469 |
| 6,127,048 | A * | 10/2000 | Beele | C23C 14/024 416/241 B |
| 6,319,614 | B1 * | 11/2001 | Beele | C23C 14/08 428/469 |
| 6,455,167 | B1 * | 9/2002 | Rigney | C23C 28/00 416/241 R |
| 6,485,845 | B1 * | 11/2002 | Wustman | C23C 28/00 416/241 B |
| 6,974,641 | B1 | 12/2005 | Choy et al. | |
| 9,395,301 | B2 * | 7/2016 | Cheverton | G01J 5/10 |
| 2002/0098776 | A1 * | 7/2002 | Dopper | B24C 1/06 451/2 |
| 2002/0132131 | A1 * | 9/2002 | Bossmann | C23C 28/00 428/615 |
| 2005/0053467 | A1 * | 3/2005 | Ackerman | C23C 10/02 416/241 R |
| 2005/0079368 | A1 * | 4/2005 | Gorman | C23C 4/02 428/469 |
| 2005/0161439 | A1 * | 7/2005 | Wustman | C23F 1/44 216/103 |
| 2006/0222884 | A1 * | 10/2006 | Nagaraj | C23C 18/1208 428/688 |
| 2007/0015283 | A1 | 1/2007 | Choy et al. | |
| 2008/0166589 | A1 * | 7/2008 | Albrecht | C23C 10/16 428/670 |
| 2009/0226326 | A1 | 9/2009 | Choy et al. | |
| 2011/0069735 | A1 | 3/2011 | Feist et al. | |
| 2012/0018433 | A1 | 1/2012 | Le Bris et al. | |

FOREIGN PATENT DOCUMENTS

| | | | |
|---|---|---|---|
| WO | 00 06796 | 2/2000 | |
| WO | WO-2008113695 A2 * | 9/2008 | ............ C23C 30/00 |
| WO | WO 2009/083729 A1 | 7/2009 | |

OTHER PUBLICATIONS

International Search Report dated Dec. 9, 2013 in PCT/FR13/051931 Filed Aug. 12, 2013.

* cited by examiner

METHOD OF MEASURING THE TEMPERATURE REACHED BY A PART, IN PARTICULAR A TURBINE ENGINE PART

The present invention relates to a method of measuring the temperature reached by a part, in particular a turbine engine part.

The invention satisfies in particular the need for being able to detect the temperatures to which various parts of a turbine engine have been subjected, for example in operation or during tests.

In operation, the parts of the turbine engine are subjected to very considerable mechanical and thermal stresses due in particular: to the high speed of rotation of the turbine engine (which is capable of reaching 18,000 revolutions per minute (rpm)); to the wear or erosion linked with the gas streams (considerable variations in temperature; flows that are very turbulent and fast, that may even be sonic at the tips of the blades; parts impacted on by the flow of gas); to the high temperature of the gas; and to the polluted environment of the turbine engine (combustion gas, soot, solid particles, oil leakages, fuel leakage).

Furthermore, the characteristics of the parts are very different, whether in size (areas of a few square centimeters ($cm^2$) to several square meters ($m^2$)), in nature (metallic, composite, covered with thermal barriers, made of titanium, made of carbon), in shape (plane, curved, twisted), and with or without the presence of multiple perforations or cooling systems.

All this makes it relatively complicated to develop a method for determining the temperatures to which the various parts have been subjected.

It is known to apply thermosensitive paint to parts, which thermosensitive paint is designed to change color locally and in irreversible manner when the parts are exposed to high temperatures.

At the end of a period of operation or testing, tables are used to deduce the temperature to which each zone of the part has been subjected, as a function of its color.

Such thermosensitive paints erode quickly in the event of impacts caused by the hot and turbulent flows. Temperatures can then be measured only during the first minutes of a test on turbine blades, for example. Also, those paints provide only discrete measurements of the temperatures reached, in stages of 10° C. to 220° C. as a function of the paints. When the paints are designed to change color, their colors are analyzed visually by operators, and that can generate errors of judgment. Finally, such paints are generally toxic (presence of lead, chromium, nickel . . . ).

Another type of coating, described in document WO 2009/083729, comprises luminescent dopants that, when they are exposed to high temperatures, have specific luminescent characteristics. By illuminating the part using a light source, it is possible to detect the luminescent characteristics of the various zones of the part and to deduce therefrom the temperatures to which the various zones have been subjected, by comparison with standards.

That type of coating presents problems of retention on the parts and problems of premature erosion in the event of impacts caused in particular by the hot and turbulent flows.

There also exist temperature markers that are used only for measurements in real time. For a measurement in real time, e.g. on a blade of a turbine engine, the measurements taken are inaccurate because the high speeds of rotation cause the blade to move through as much as several centimeters during acquisition.

Also, the parts inside the turbine engine (combustion chamber, movable blades, high-pressure nozzle, cheek plates, disks, rings . . . ) are not very accessible during the tests and the external parts (casings, . . . ) are difficult to analyze because they are three-dimensional and of large area. Also, measurements are disturbed because the beam of light necessary for taking measurements passes through a medium that is polluted (particles, soot, . . . ).

A particular object of the present invention is to provide a solution to these problems that is simple, effective and inexpensive.

For this purpose, the invention provides a method of treating a part, in particular a turbine engine part, making it possible to measure the temperature reached by the part in operation, the method comprising the successive steps consisting in:

mechanically treating the part;
oxidizing the part; and
depositing at least one layer comprising indicator means for indicating and recording the temperature reached by the part in operation.

The part is thus covered with a layer comprising temperature indicator means for indicating the temperature to which the part has been subjected, so that it is able to keep a record of the temperature reached by the corresponding zone of the part. Information concerning the temperature reached can thus be provided, even after stopping the turbine engine (deferred measurement).

The oxidation step involves a chemical reaction of oxidation and the formation of metallic oxides generating a certain amount of roughness on the surface of the part.

The mechanical treatment of the part and the step of oxidizing it, thus improve the retention and the strength of the above-mentioned layer.

In an embodiment of the invention, the layer comprising the temperature indicator means is deposited by air plasma spraying (APS).

In another embodiment of the invention, the layer comprising the temperature indicator means is deposited by electron beam physical vapor deposition (EB-PVD).

Such a method seeks to form a layer by deposition in a vacuum evaporation enclosure, using electron bombardment.

In yet another embodiment, the layer comprising the temperature indicator means is an oxide-based layer deposited using the sol-gel method.

Under such circumstances, the layer deposited by using the sol-gel method may be subjected to heat treatment.

Preferably, the temperature indicator means are made from ceramics doped with phosphors, such as rare earths and/or metal oxides, in order to emit photons by luminescence when the corresponding layer is illuminated by a light source.

In particular, such means are known from document WO 2009/083729.

Also, the part is treated mechanically by sandblasting, for example by sandblasting with corundum, before depositing of the layer comprising means for indicating the temperature reached by the part in operation.

Furthermore, the oxidizing step may be obtained by subjecting the part to an oxidizing atmosphere (e.g. air) and at a temperature lying in the range 600° C. to 950° C., for a duration lying in the range 30 minutes to 1 hour 30 minutes.

The invention also relates to a turbine engine part obtained by implementing the above-mentioned method, including at least one layer comprising temperature indicator means for indicating the temperature reached by the part in operation.

In another implementation of the invention, the part comprises a substrate, and the method comprises the steps consisting of:
- depositing a metallic underlayer on the substrate;
- mechanically treating the underlayer by sandblasting;
- depositing a first layer forming a thermal barrier on the underlayer; and
- depositing a second layer comprising temperature indicator means for indicating the temperature to which the part is subjected in operation, the part comprising the substrate, the metallic underlayer, the first layer, and the second layer.

In this method, the second layer further comprises temperature indicator means for indicating the temperature to which the part has been subjected, so that it is able to keep a record of the temperature reached by the corresponding zone of the part.

Information concerning the temperature reached can thus be provided, even after stopping the turbine engine (deferred measurement).

The method may also include a step of depositing an additional layer comprising temperature indicator means for indicating the temperature reached by the part in operation, said additional layer being deposited between the metal underlayer and the layer forming a thermal barrier.

In this way, the part comprises two distinct layers with temperature markers, one of these layers being suitable for providing an indication about the temperature of the gas outside the part, the other layer being suitable for providing an indication about the temperature reached within the part and/or an indication of the performance of the layer forming a thermal barrier.

The underlayer may be made of a material of the MCrAlY type, in which M is selected from the group comprising Ni, Co, and NiCo.

Also, depositing the underlayer may comprise a step of depositing platinum, for example by electro-deposition, and/or a step of depositing aluminum, for example by vapor phase aluminizing.

Finally, the invention also provides a turbine engine part obtained by implementing the above-mentioned method, the part comprising a substrate that is covered, at least in part, with a metallic underlayer on which are deposited a first layer forming a thermal barrier and a second layer comprising temperature indicator means for indicating the temperature reached by the part.

The invention can be better understood and other details, characteristics and advantages of the invention appear on reading the following description made by way of nonlimiting example and with reference to the accompanying drawings, in which:

FIG. 1 shows a portion of a part 1 for a turbine engine, such as for example a turbine blade that is obtained by performing a first method of the invention.

Figure 1:
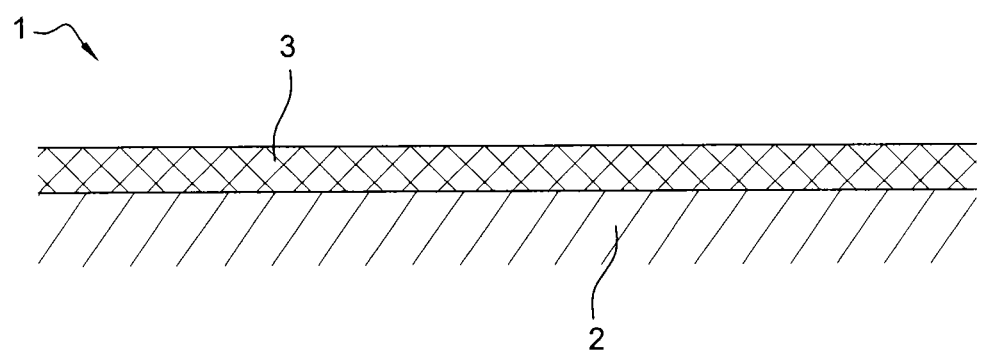
FIG. 1 is a diagrammatic view of a portion of a part constituting a first embodiment of the invention.

In general manner, the invention relates to any type of turbine engine part, such as for example movable or stationary blades of high- or low-pressure compressors and turbines, rings, cheek plates, disks, chamber or turbine casings, deflectors and ferrules of the combustion chambers, flaps, arms, the exhaust cone, or indeed the jackets of afterburner channels.

By way of example, the part 1 comprises a substrate 2 made of a nickel- and/or cobalt-based superalloy.

A first step consists in treating the substrate 2 mechanically, e.g. by sandblasting with corundum. The particle size of the powder used for sandblasting with corundum lies in the range 150 micrometers ($\mu$m) to 250 $\mu$m, for example.

The substrate 2 is then oxidized by subjecting it to an oxidizing atmosphere (e.g. air), at a temperature lying in the range 600° C. to 950° C., for a length of time lying in the range 30 minutes to 1 hour 30 minutes.

A layer 3 is applied on the outer surface of the substrate 2 and comprises temperature indicator means for indicating the temperature reached by the part 1 in operation. Said temperature indicator means are made of ceramics doped with phosphors, such as rare earths and/or metal oxides, in such a manner as to emit photons by luminescence when said layer 3 is illuminated by a light source. The luminescence signal emitted in this way is a function of the maximum temperature reached by part 1. These markers thus keep a record of the maximum temperature reached by the part 1.

The mechanical treatment and the step of oxidizing the substrate 2 make it possible to increase the bonding and strength of the above-mentioned layer 3 on the substrate 2.

In an implementation of the invention, the layer 3 is deposited by air plasma spraying (APS).

In a variant, this layer 3 is deposited by electron beam physical vapor deposition (EB-PVD).

In another implementation, the layer 3 is a layer of paint comprising a binder, a solvent, and the above-mentioned temperature markers. By way of example, this layer of paint is deposited using a spray gun. In yet another variant, said layer 3 is deposited via the sol-gel method, as is known from document FR 2 957 358.

It should be observed that the sol-gel method is a "soft chemistry" synthesis method used for the preparation of oxide type ceramic layers and powders at low temperature (in particular at ambient temperature). This method uses a mixture of ionic precursors (metal salts) and/or molecular precursors (metal alcoxides). In this liquid phase, referred to as a "sol" (the sol comprises a solvent and dispersed precursors), the chemical reactions of hydrolysis and condensation contribute to forming a three-dimensional inorganic lattice (gel) with infinite viscosity in which the solvent remains. In the invention, the temperature markers are contained in the precursors (monomers) that are dispersed in the sol. After hydrolysis and condensation of the precursors, a gel is obtained that is dried in order to remove the solvent.

In order to remove the solvent, two types of drying are possible.

Firstly, conventional drying by stoving at low temperature and atmospheric pressure makes it possible to dry the zirconia precursor gel to form a xerogel in which the three-dimensional lattice of the gel disappears.

Secondly, it is possible to perform drying under supercritical conditions (e.g. a few hours at a temperature lying in the range 250° C. to 300° C.), which makes it possible, after evaporation of the solvent, to preserve the three-dimensional lattice of the gel. Under such circumstances, an aerogel is formed.

At the end of drying (conventional or supercritical) a calcination step is performed (e.g. of a few hours at a temperature lying in the range 900° C. to 1000° C.). This step leads to formation of a powder.

It should be observed that for an aerogel, the particles are much smaller (of size that is less than 500 nanometers (Nm)), monodisperse, and of higher specific surface area.

In addition to having a synthesis temperature that is lower than in traditional projection methods (in particular EB-PVD), the sol-gel method further makes it possible to obtain not only zirconium oxides of great purity but also zirconium oxides doped with elements such as yttrium or other rare earths.

By way of example, the thickness of the layer 3 lies in the range 10 µm to 200 µm. This thickness may vary as a function of the temperature to which the part 1 is subjected.

Figure 2:
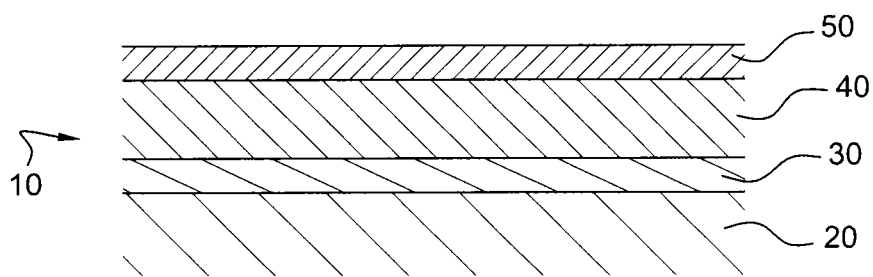
FIG. 2 is a diagrammatic view of a portion of a part constituting a second embodiment of the invention.

FIG. 2 shows a portion of a turbine engine part 10, such as for example a turbine blade that is obtained by performing a second method of the invention.

By way of example, the part 10 comprises a substrate 20 made from a nickel- and/or cobalt-based superalloy.

A first step consists in depositing a bonding metallic underlayer 30 on a surface of the substrate 20. This underlayer 30 preferably has a coefficient of thermal expansion that is close to that of the substrate 20.

By way of example, the underlayer 30 is made of an alloy of the MCrAlY type, M being selected from nickel, cobalt, or a mixture of these metals. Under such circumstances, the underlayer 30 is for example deposited by APS and the thickness of the underlayer 30 is for example less than 50 µm.

In a variant, the underlayer 30 may be a layer of platinum, made by electro-deposition, and/or a layer of aluminum, deposited by vapor phase aluminizing (VPA).

Under such circumstances, the thickness of the layer of platinum lies in the range 5 µm to 10 µm, for example, and the thickness of the layer of aluminum lies in the range 5 µm to 20 µm.

The underlayer 30 is then treated mechanically, e.g. by sandblasting, preferably by sandblasting with corundum, before a first layer 40 is deposited on the underlayer 30. The particle size of the powder used for sandblasting with corundum lies in the range 150 µm to 250 µm, for example.

The metallic underlayer 30 provides bonding between the substrate 20 and the first layer 40. The bonding between the underlayer 30 and the substrate 20 of the part 10 is obtained by mutual diffusion, and the bonding between the underlayer 30 and the first layer 40 is obtained by mechanical anchoring and by the propensity, at high temperature, of the underlayer 30 to develop a thin oxide layer at the interface between the underlayer 30 and the first layer 40, which thin oxide layer provides chemical contact with the first layer 40. Also, the metallic underlayer 30 protects the part 10 against corrosion phenomena.

As is known from document FR 2 957 358, the first layer 40 forms a thermal barrier and includes for example, a ceramic layer based on yttria-based zirconia, namely a yttria-stabilized zirconia having a molar content of yttria (yttrium oxide) that lies in the range 4% to 12%, and that presents a coefficient of thermal expansion that is different from that of the superalloy constituting the substrate 20 and rather low thermal conductivity. In some circumstances, the stabilized zirconia may also contain at least one oxide of an element selected from the group made up of rare earths, preferably from the group: Y (yttrium), Dy (dysprosium), Er (erbium), Eu (europium), Gd (gadolinium), Sm (samarium), Yb (ytterbium), or a combination of a tantalum oxide (Ta) and of at least one rare earth oxide, or with a combination of an oxide of niobium (Nb) and of at least one rare earth oxide.

For a turbine blade, for example, this thermal barrier 40 makes it possible in particular to increase the temperature of gas admitted into the turbine and to reduce the flow of cooling air, and thus to improve the efficiency of the turbine engine. It should be observed that the temperature limit for using superalloys is about 1100° C., whereas the temperature of the gas at the outlet from the combustion chamber or at the inlet to the turbine may reach 1600° C.

A second layer 50 is then deposited on the thermal barrier 40. This second layer 50 comprises temperature indicator means for indicating the temperature to which the part 10 has been subjected, also referred to as temperature markers. Said temperature indicator means are made from ceramics doped with phosphors, such as rare earths and/or metal oxides, in such a manner as to emit photons by luminescence when the second layer 50 is illuminated by a light source. The luminescence signal emitted in this way is a function of the maximum temperature reached by the part 10. These markers thus keep a record of the maximum temperature reached by the part 10.

In the FIG. 2 embodiment, the first and second layers 40, 50 are distinct from each other and are deposited sequentially.

Figure 3:
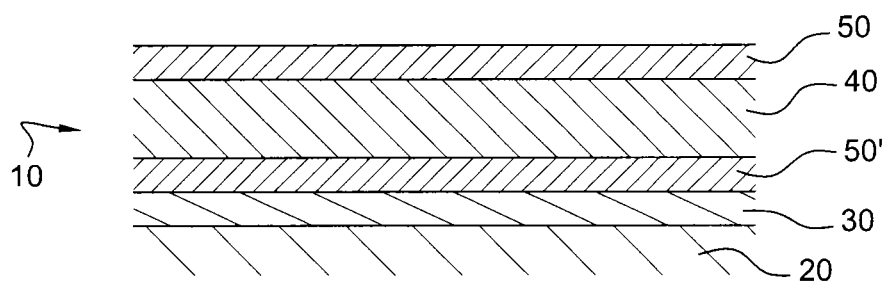
FIG. 3 is a diagrammatic view of a portion of a part constituting a third embodiment of the invention.

In a variant shown in FIG. 3, another layer 50' is deposited between the layers 30 and 40, with the composition of the layer 50' being identical or similar to that of the layer 50. The layer 50' thus also comprises temperature markers.

More precisely, the temperature markers of the layer 50 provide an indication of the temperature of the gas at the outer wall of the part and the temperature markers of the layer 50' provide an indication of the temperature reached within the part, on the other side of the thermal barrier 40. The temperature markers of the layer 50' may also provide an indication of the performance of the thermal barrier 40.

Figure 4:
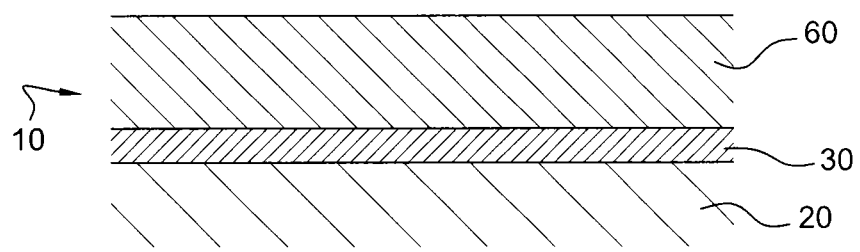
FIG. 4 is a diagrammatic view of a portion of a part constituting a fourth embodiment of the invention.

In another embodiment, shown in FIG. 4, the first layer 40 and the second layer 50 are deposited simultaneously and form a single layer 60.

The first layer 40 and/or the second layer 50 may be deposited by APS.

In a variant, the first layer 40 and/or the second layer 50 may be deposited by EB-PVD.

In FIGS. 2 and 3, by way of example, the thickness of the layer 40 lies in the range 1 µm to 300 µm and the thickness of layer 50 and/or the additional layer 50' lies in the range 10 µm to 50 µm, for example. In FIG. 4, by way of example, the shared layer 60 has a thickness lying in the range 1 µm to 300 µm. These thicknesses can vary depending on the temperatures to which the parts are to be subjected.

Four examples are described below. Examples 1 and 2 refer to the embodiment of FIG. 2, examples 3 and 4 refer to the embodiment of FIG. 3, and examples 5 and 6 refer to the embodiment of FIG. 4. Each example describes the successive steps of the corresponding method.

EXAMPLE 1

Using the APS method to deposit an underlayer 30 made of a material of the MCrAlY type, where M belongs to the group (Ni, Co, NiCo);
Sandblasting the underlayer 30 with corundum;
Using the APS method to deposit the first layer 40 forming the thermal barrier;

Using the APS method to deposit the second layer 50 comprising the temperature markers.

EXAMPLE 2

Electro-deposition of a platinum layer;
Deposition by vapor phase aluminizing (VPA) of an aluminum layer forming, with the platinum layer, an underlayer 30;
Sandblasting the underlayer 30 with corundum;
Using the EB-PVD method to deposit the first layer 40 forming the thermal barrier;
Using the EB-PVD method to deposit the second layer 50 comprising the temperature markers.

EXAMPLE 3

Depositing using the APS method of an underlayer 30 made of a material of the MCrAlY type, where M belongs to the group (Ni, Co, NiCo);
Sandblasting the underlayer 30 with corundum;
Using the APS method to deposit the layer 50' comprising the temperature markers;
Using the APS method to deposit the layer 40 forming the thermal barrier;
Using the APS method to deposit the layer 50 comprising the temperature markers.

EXAMPLE 4

Electro-deposition of a platinum layer;
Deposition by vapor phase aluminizing (VPA) of an aluminum layer forming, with the platinum layer, an underlayer 30;
Sandblasting the underlayer 30 with corundum;
Using the EB-PVD method to deposit the layer 50' comprising the temperature markers;
Using the EB-PVD method to deposit the layer 40 forming the thermal barrier;
Using the EB-PVD method to deposit the layer 50 comprising the temperature markers.

EXAMPLE 5

Depositing using the APS method of an underlayer 30 made of a material of the MCrAlY type, where M belongs to the group (Ni, Co, NiCo);
Sandblasting the underlayer 30 with corundum;
Using the APS method to deposit a layer 60 forming the thermal barrier and comprising the temperature markers.

EXAMPLE 6

Electro-deposition of a platinum layer;
Deposition by vapor phase aluminizing (VPA) of an aluminum layer forming, with the platinum layer, an underlayer 30;
Sandblasting the underlayer 30 with corundum;
Using the EB-PVD method to deposit a layer 60 forming the thermal barrier and comprising the temperature markers.

The invention claimed is:

1. A method of treating a turbine engine part to permit deferred measurement of a temperature reached by the turbine engine part during operation, the method comprising:

depositing a metallic underlayer on a substrate part;
mechanically treating the metallic underlayer by sandblasting;
depositing a first temperature indicating layer of at least two temperature indicating layers on the metallic underlayer;
depositing a thermal barrier layer on the first temperature indicating layer, wherein the thermal barrier layer does not include a temperature marker; and
depositing a second temperature indicating layer of the at least two temperature indicating layers on the thermal barrier layer, wherein
the first temperature indicating layer includes the temperature marker for indicating and recording a temperature to which the turbine engine part is subjected in operation, and
the second temperature indicating layer includes the same temperature marker as the first temperature indicating layer for indicating and recording a temperature of a gas at an outer surface of the turbine engine part.

2. A method according to claim 1, wherein the temperature marker of the second temperature indicating layer is further indicating and recording a maximum temperature of the thermal barrier layer.

3. A method according to claim 1, wherein the metallic underlayer includes a material of MCrAlY type, in which M is selected from a group consisting of Ni, Co, and NiCo.

4. A method according to claim 1, wherein the metallic underlayer includes at least one of platinum and aluminum.

5. A method according to claim 4, wherein
the metallic underlayer includes platinum, and
a thickness of the metallic underlayer is between 5 μm and 10 μm.

6. A method according to claim 4, wherein
the metallic underlayer includes aluminum, and
a thickness of the metallic underlayer is between 5 μm and 20 μm.

7. A turbine engine part obtained by implementing the method according to claim 1.

8. A method according to claim 1, wherein
the metallic underlayer is configured to provide a bonding between the substrate part and the first temperature indicating layer,
the metallic underlayer and the substrate part are bonded by mutual diffusion, and
the metallic underlayer and the first temperature indicating layer are bonded by mechanical anchoring and oxidizing the metallic underlayer.

9. A method according to claim 1, wherein
at least one of the thermal barrier layer and the second temperature indicating layer is deposited by air plasma spraying.

10. A method according to claim 1, wherein
at least one of the thermal barrier layer and the second temperature indicating layer is deposited by electron beam physical vapor deposition.

11. A method according to claim 1, wherein
a thickness of the thermal barrier layer is between 1 μm and 300 μm, and a thickness of at least one of the first temperature indicating layer and the second temperature indicating layer is between 10 μm and 50 μm.

12. A method according to claim 1, wherein
a thickness of the first temperature indicating layer, a thickness of the second temperature indicating layer, and/or a thickness of the thermal barrier layer is selected based on the temperature of the gas at the outer surface of the turbine engine part.

* * * * *

UNITED STATES PATENT AND TRADEMARK OFFICE
CERTIFICATE OF CORRECTION

PATENT NO.         : 10,539,039 B2
APPLICATION NO.    : 14/420481
DATED              : January 21, 2020
INVENTOR(S)        : Nadine Alice Helene Harivel et al.

Page 1 of 1

It is certified that error appears in the above-identified patent and that said Letters Patent is hereby corrected as shown below:

On the Title Page

Item (72), Inventors, Line 1, delete "Vauz" and insert -- Vaux --.

In the Specification

In Column 1, Line 50, delete "nickel . . . )." and insert -- nickel, . . . ). --.

In Column 2, Line 3, delete "rings . . . )" and insert -- rings, . . . ) --.

In Column 4, Line 45, delete "alcoxides)." and insert -- alkoxides). --.

Signed and Sealed this
Nineteenth Day of May, 2020

Andrei Iancu
*Director of the United States Patent and Trademark Office*